United States Patent [19]

Sywyk et al.

[11] Patent Number: 6,005,796
[45] Date of Patent: *Dec. 21, 1999

[54] SINGLE ENDED SIMPLER DUAL PORT MEMORY CELL

[75] Inventors: Stefan P. Sywyk, San Jose; Richard K. Chou, Sunnyvale, both of Calif.; Andrew L. Hawkins, Starkville, Mich.

[73] Assignee: Cypress Semiconductor Corporation, San Jose, Calif.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/789,300

[22] Filed: Jan. 30, 1997

Related U.S. Application Data

[63] Continuation of application No. 08/362,814, Dec. 22, 1994, abandoned.

[51] Int. Cl.$^6$ .................................................. G11C 11/00
[52] U.S. Cl. ...................................... 365/156; 365/230.05
[58] Field of Search .............................. 365/230.05, 154, 365/156, 230.04

[56] References Cited

U.S. PATENT DOCUMENTS

| 5,289,432 | 2/1994 | Dhong | 365/230.05 |
| 5,424,995 | 6/1995 | Miyazaki | 365/230.05 |
| 5,428,574 | 6/1995 | Kuo | 365/201 |
| 5,434,818 | 7/1995 | Byers | 365/230.05 |

FOREIGN PATENT DOCUMENTS 0 434 852 A1  12/1989  European Pat. Off. .

OTHER PUBLICATIONS

Helmut Liedl and Kurt Marquardt, "Dual–Port RAM for Cost–attractive Multi–Microcontroller Systems", *Siemans Components*, vol. 25, No. 5, pp. 163–166 (Oct. 25, 1990).

Feipei Lai, Ying Lang Chuang and Shyh Jong Chen, "A New Design Methodology for Multiport SRAM Cell", *IEEE Transactions on Circuits and Systems I: Fundamental Theory and Applications*, vol. 41, No. 11, pp. 677–685, (Nov. 1994).

Ukita, et al., "A Single–Bit–Line Cross–Point Cell Activation (SCPA) Architecture for Ultra–Low–Power SRAM's", IEEE Journal of Solid–State Circuits, vol. 28, No. 11, Nov. 1993, pp. 1114–1118.

*Primary Examiner*—A. Zarabian
*Attorney, Agent, or Firm*—Blakely, Sokoloff Taylor & Zafman LLP

[57] ABSTRACT

A single ended simplex dual port memory cell is described. One port of the memory cell is dedicated for writing operations and the other port of the memory cell is dedicated for reading operations. A bit of data received from the first port can be stored in the memory cell. The second port can detect the memory cell contents substantially simultaneously as the memory cell is storing a bit of data from the first port. Each port is optimized for its respective dedicated operation. In other words, one port is optimized for write operations and the other port is optimized for read operations. Because one port of the memory cell is optimized for write operations and the other port of the memory cell is optimized for read operations, the cell does not require multiple wordline voltages for each port.

21 Claims, 7 Drawing Sheets

SINGLE ENDED SIMPLER DUAL PORT MEMORY CELL

This is a continuation divisional of application Ser. No. 08/362,814, filed Dec. 22, 1994, now abandoned.

FIELD OF THE INVENTION

This invention relates to the field of semiconductor memories. More particularly, this invention relates to providing a smaller dual port SRAM memory cell.

BACKGROUND OF THE INVENTION

A typical random access memory (RAM) architecture consists of an array of memory cells. Each cell can store one bit of information. The array is arranged as rows and columns of memory cells. Each row is also referred to as a wordline. Each column is also referred to as a bitline. A memory device containing such an array with $2^m$ rows and $2^n$ columns can store $2^{m \cdot n}$ bits of information. If fabrication of such an array requires one unit of area, then the memory cell density for such an array is $2^{m \cdot n}$ cells per unit area.

In systems which require memory devices, storage capacity and operational speed of the memory are important attributes. From a system throughput standpoint, the accessibility of the memory device is another important attribute. Storage capacity refers to the amount of data that a memory device can store. Operational speed refers to the speed at which the memory device can store or retrieve data. Accessibility is largely dependent upon the architecture of the system. Generally, the system throughput increases when more than one system device can directly access the memory device. The system throughput is generally further increased when more than one device can simultaneously access the memory.

Since a memory device typically contains one or more arrays of memory cells, the storage capability of a memory device is largely dependent upon the size of a memory cell. The size of a cell given a fixed number of components will change as fabrication technology evolves. However, any reduction in the size of a memory cell will permit fabrication of memory devices containing an increased density of memory cells. A reduction in cell area will permit an increase in an array's cell density by a factor approaching the reduction factor.

Thus, for example, a cell which uses 40% of the area of another cell will have a reduction factor of 2.5. Therefore, an array of the smaller cells may have a cell density approaching 2.5 times that of an array of the larger cells.

Storage capacity is directly related to cell density. Given a fixed unit of area for an array of memory cells, a reduction factor of 2.5 will permit memory devices constructed with the smaller cells to have up to 2.5 times the storage capacity of memory devices constructed with the larger cells.

System access speed can often be dramatically increased through the use of a dual port memory architecture. A dual port memory has two access ports so that more than one system device may directly access the memory. A single port memory permits direct coupling to only one system device such that other system devices must contend for the port in order to gain access to the memory. By permitting direct coupling to more than one system device, overall system performance is usually enhanced since a dual port architecture decreases the contention for access to a port of the memory.

Examples of memory devices utilizing a dual port memory architecture include dual port static random access memories (SRAMs) and first-in-first-out ("FIFO") buffers. An integrated circuit dual port memory device may include an array of dual port memory cells. One such prior art dual port cell is illustrated in FIG. 1.

Traditional dual port memory cells suffer from a number of disadvantages. One disadvantage of the prior art dual port memory cell is that the layout size of such a cell is approximately 2–2.5 times the size of a single port cell constructed using the same fabrication technology. Another disadvantage of the prior art dual port memory cell is that a pair of bitlines are required for each port due to the differential nature of the cell.

Another method of achieving the effect of a dual port memory device in practice is to use an array of single port memory cells inside the dual port memory device. Such a prior art single port memory cell is illustrated in FIG. 2. In this example, the ports of the memory device are multiplexed before gaining access to the memory array. Thus two devices are contending for access at the device level as opposed to at the level of a memory cell in the array.

One disadvantage of using multiplexed single port memory cells is that the multiplexing circuitry uses space which could otherwise be utilized to construct more memory cells. In addition, the multiplexing function for accessing a single port cell is slower than the direct access method using a dual port memory cell. This typically results in a slower operational speed for the memory device. The slower operational speed of the memory tends to negatively affect the throughput of the entire system if memory accesses are frequently requested.

SUMMARY AND OBJECTS OF THE INVENTION

A single ended dual port memory cell is described. The memory cell can store a bit of data received from one of a first port and a second port. The first and second ports can simultaneously detect the stored bit.

The single ended dual port memory cell can be used in applications where one port is dedicated for read operations and another port is dedicated for write operations. In such applications, the single ended dual port memory cell functions as a single ended simplex dual port memory cell and the ports may be optimized for their respective dedicated read or write operations.

Other objects, features, and advantages of the present invention will be apparent from the accompanying drawings and from the detailed description that follows below. dr

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 3:
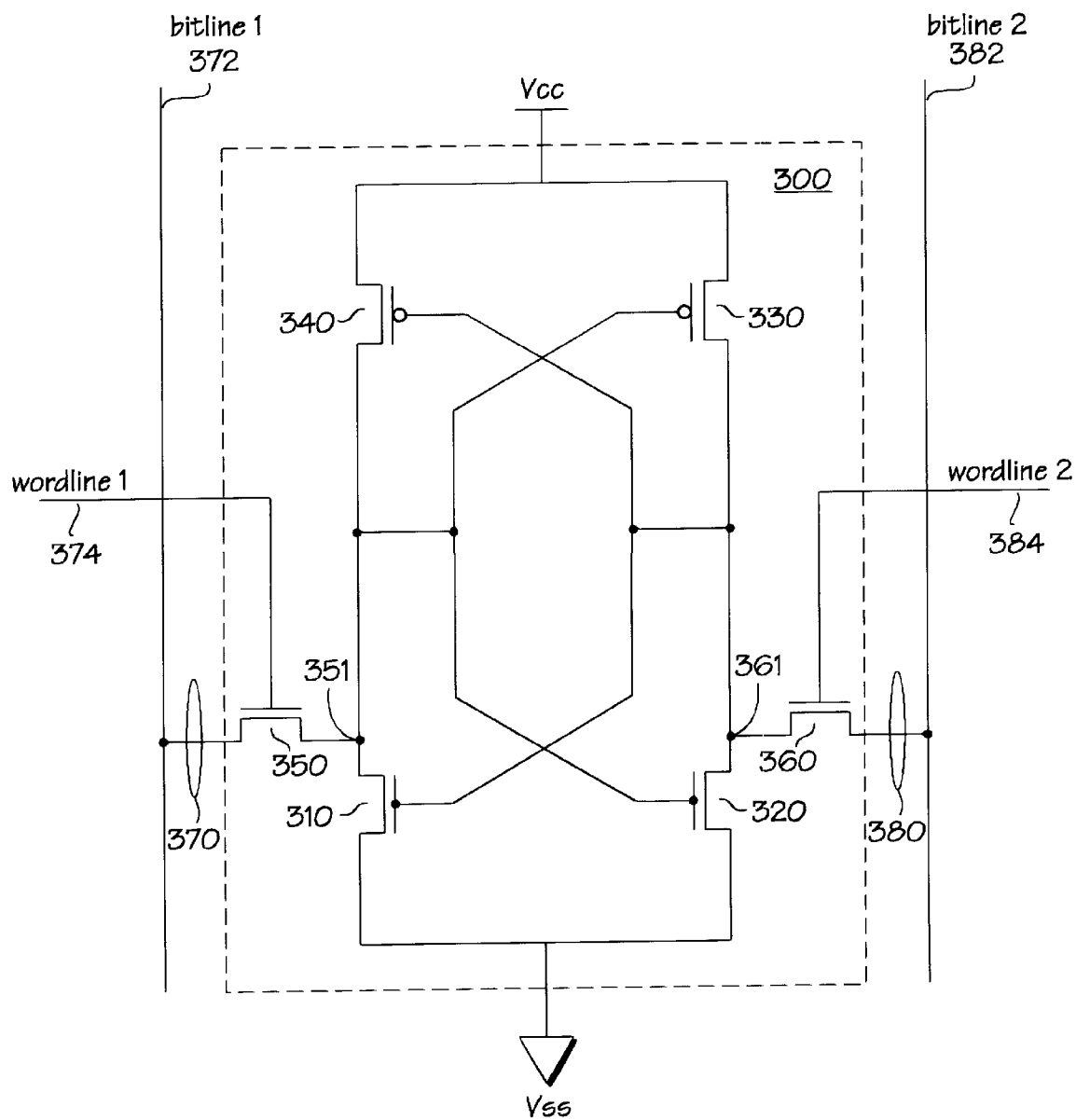
FIG. 3 illustrates a schematic for a single ended dual port memory cell.

FIG. 3 illustrates the circuit diagram for one embodiment of a single ended dual port static memory cell as implemented using metal oxide semiconductor (MOS) technology. The cell 300 of FIG. 3 is a static random access memory (SRAM) cell. A dual port memory device may include an array of such cells.

NMOS transistors 350 and 360 serve as pass gates to bitlines 372 and 382 of the first 370 and second 380 ports, respectively.

Figure 5:
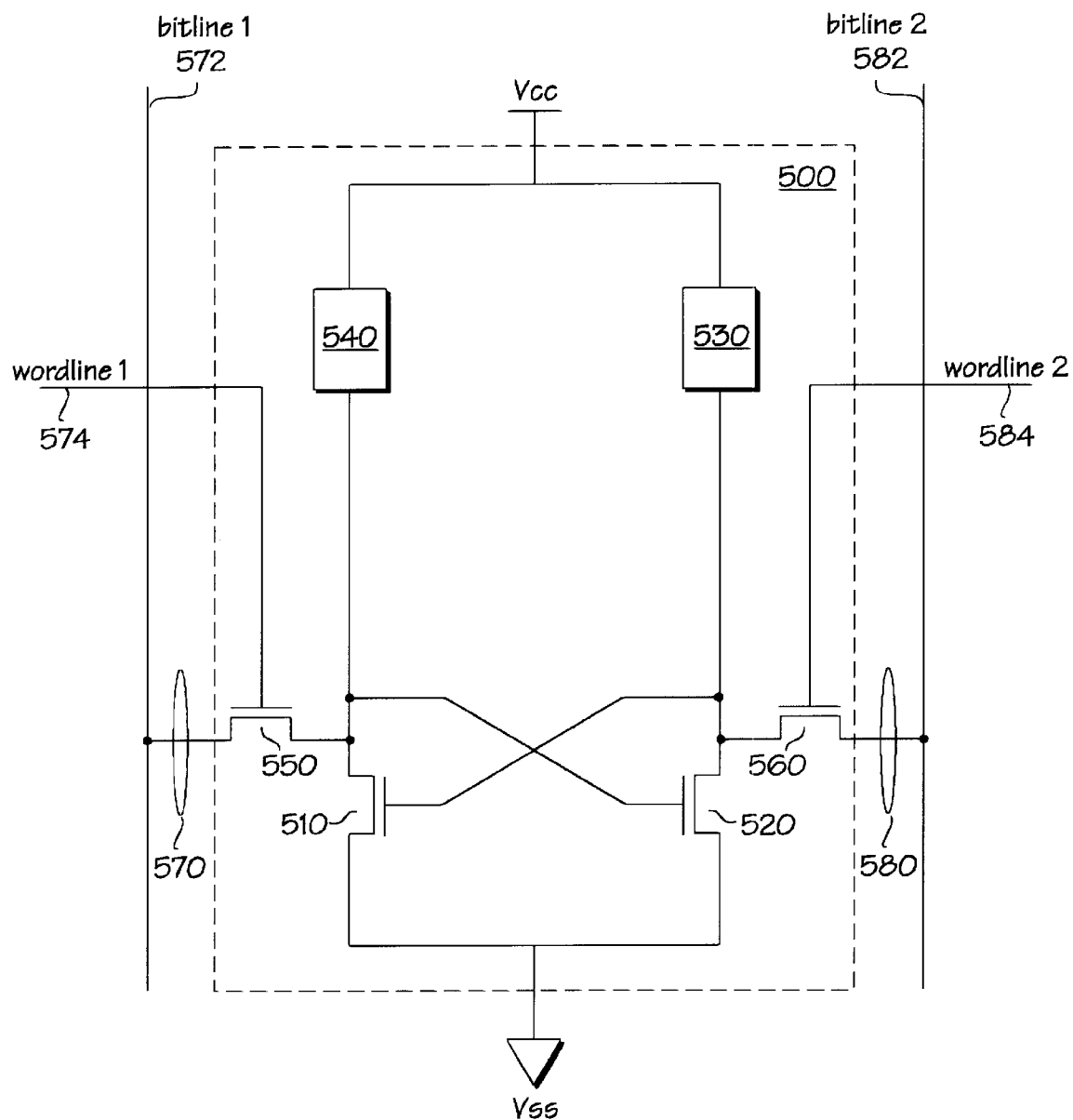
FIG. 5 illustrates an alternative embodiment for a single ended dual port memory cell.

The latch device for storing a bit of data is formed by NMOS transistors 310 and 320 and PMOS transistors 330 and 340. FIG. 5 illustrates an alternative embodiment which uses resistive load devices 530 and 540 instead of the PMOS transistors 330 and 340 of FIG. 3.

Referring to FIG. 3, first port 370 is associated with bitline 372 and wordline 374. First port bitline 372 is used for writing a single bit of data to memory cell 300 from the first port 370. First port bitline 372 is also used for reading a single bit of information from memory cell 300 via the first port 370. First port wordline 374 is used to select memory cell 300 for a read or write operation via the first port 370.

The second port operates in a similar fashion. Second port 380 is associated with bitline 382 and wordline 384. Second port bitline 382 is used for writing a single bit of data to memory cell 300 from the second port 380. Second port bitline 382 is also used for reading a single bit of information from memory cell 300 via the second port 380. Second port wordline 384 is used to select memory cell 300 for a read or write operation via the second port 380.

Both the first and second ports must utilize the same logic basis for storage in order to ensure that the first and second ports can share the memory cell. In other words, the first and second ports must both use either a positive or a negative logic system.

Figure 6:
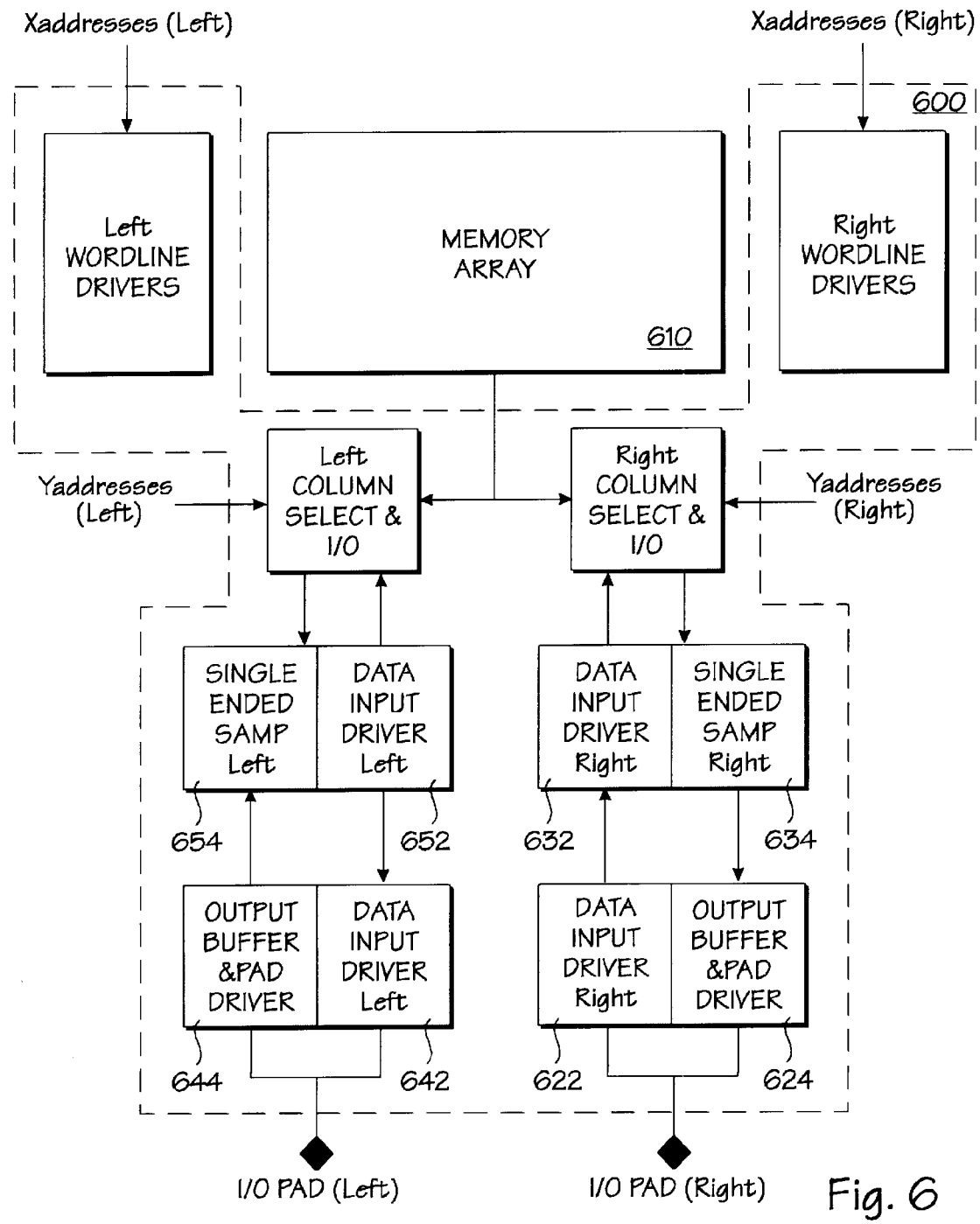
FIG. 6 illustrates a block diagram of the supporting circuitry for an array of single ended dual port memory cells.

In order to ensure that the same logic system is used by both the first and second ports, the data provided by one of the bitlines (372 or 382) should be inverted. The addition of inverting logic to the supporting circuitry for the memory array should not consume any substantial area since the inverting logic may be added at the device port level instead of at the memory cell level. FIG. 6 illustrates one embodiment of the supporting circuitry 600 for an array of single ended dual port memory cells 610 in block diagram form. For example, in a 32K×1 bit dual port memory device, inverting logic might be added to one but not both of the device ports. In FIG. 6, the right port data input buffer 622 and the port output buffer and pad driver 624 might include inverting logic to accomplish the data inversion at the port level. Another embodiment might utilize an inverting data input driver 632 and an inverting sense amplifier (SAMP) 634. This should be contrasted with requiring inverting logic for each memory cell of the array 610.

Such inverting logic is generally faster and tends to consume less area than the multiplexing circuitry of a prior art memory device which uses the multiplexed single port cells as discussed above.

Unless specifically provided for otherwise, the reading and writing examples will assume a positive logic system with respect to the first port 370. This means that a high logic level or "1" is represented by a voltage greater in magnitude than the voltage representing a low logic level or "0." The voltage level at node 351 indicates the state of the cell. Thus for purposes of example, the supporting circuitry is inverting bitline 382 signals (and not signals on bitline 372).

Figure 2:
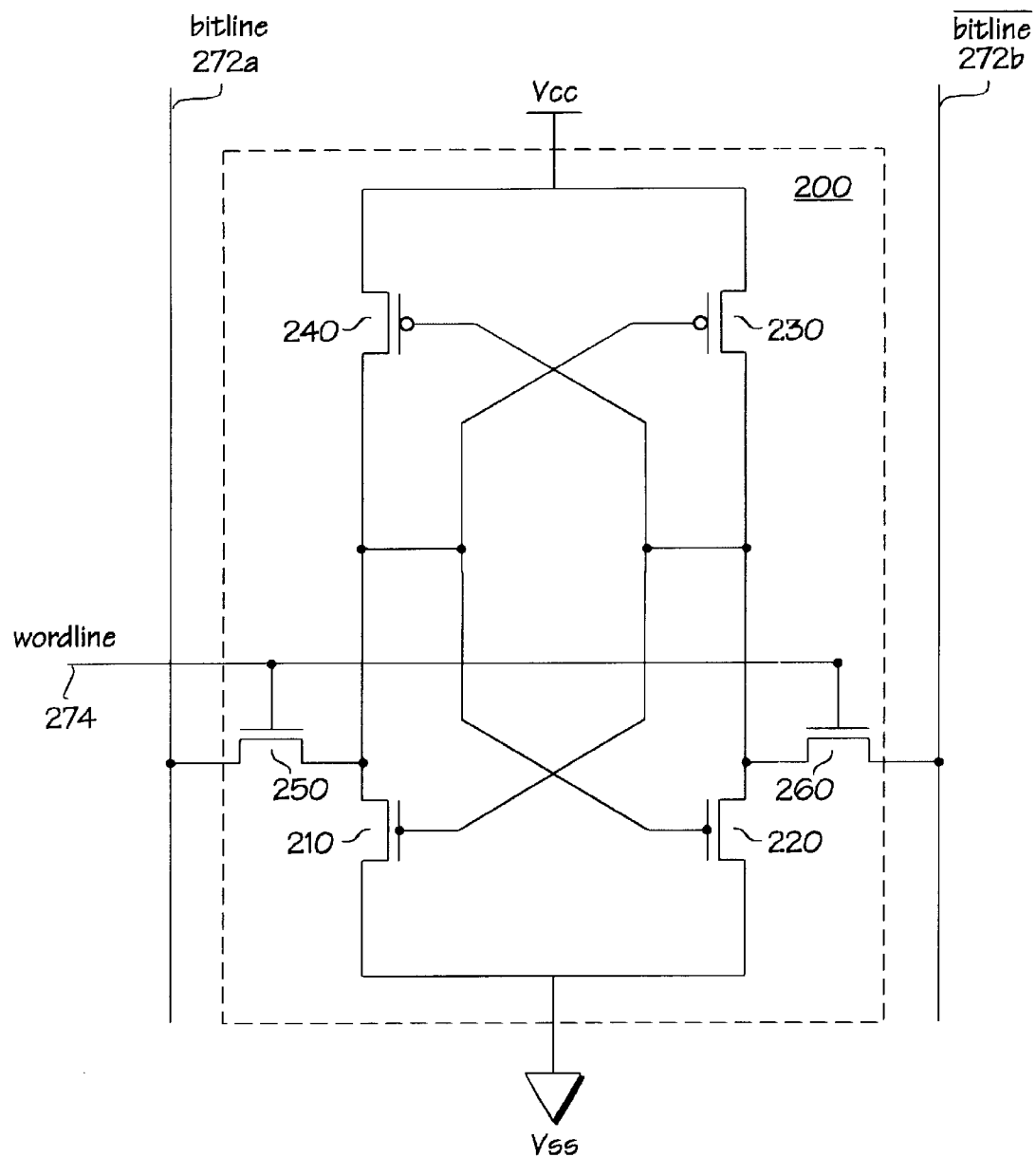
FIG. 2 illustrates a schematic for one prior art differential single port memory cell.

Typically there may be problems associated with reading or writing single ended single port memory cells as contrasted with differential cells. Referring to FIG. 2, a pair of complementary signals are supplied to differential memory cell 200 via bitlines 272a and 272b during a write operation. This helps to ensure that memory cell 200 can "flip" or change states when the cell contents do not match the value that is to be stored. For example, if a "1" is to be stored, bitline 272a will carry a logical "1" and bitline 272b will carry a logical "0." When wordline 274 is brought to a high level, one side of cell 200 is "pushed" and the other side will be "pulled" to ensure that the cell stores a logical "1." This is the differential or dual-ended nature of the cell during a write operation. In contrast, referring to the single ended cell of FIG. 3, instead of a combined "push" and "pull" action on cell 300 during a write operation there is only either a "push" or a "pull" from one port or the other. This is because there is only one bitline associated with each port and the ports operate independently from each other. Since a write or a read operation of cell 300 takes place by using a single bitline, other techniques must be utilized to ensure that memory cell 300 can be forced to change states and retain the stored value. Otherwise cell 300 may be unable to latch a value written to it during a write operation.

Figure 4:
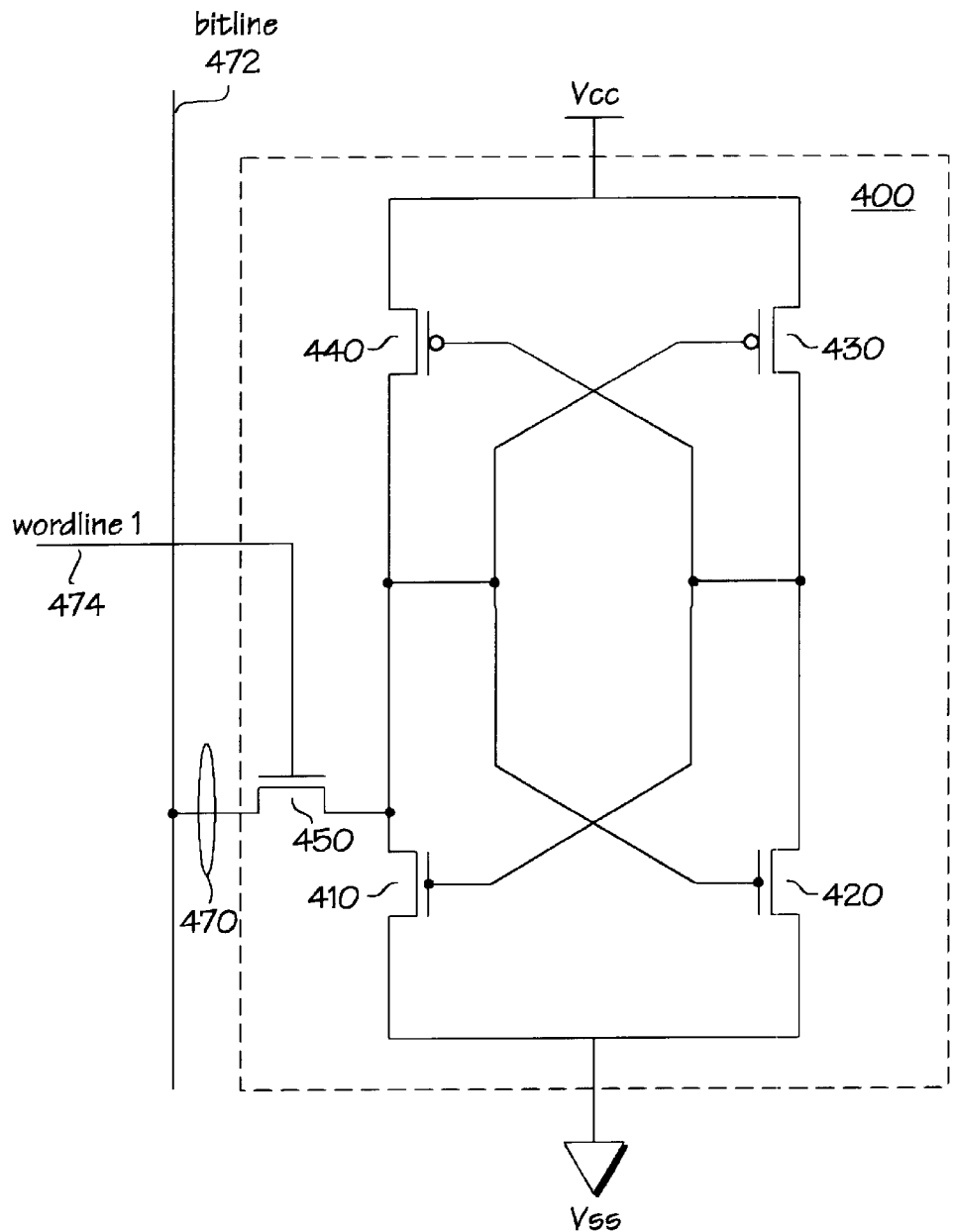
FIG. 4 illustrates a schematic for a prior art single ended single port memory cell.

A differential memory cell is generally built to maintain cell stability during read operations and the ability to latch a value during write operations without the use of special supporting circuitry such as charge pumps and reference signals. A single ended memory cell may be unable to latch the value written to it for write operations which utilize normal supporting circuitry. One embodiment of a prior art single ended single port cell is illustrated in FIG. 4. In FIG. 4, the inability to latch a value written to cell 400 is due to the low conductance (high resistance) of pass gate transistor 450 as compared to that of transistor 410.

Referring to the prior art differential memory cell 200 in FIG. 2, the ratio of the gate width-to-length ratio of transistor 210 to the gate width-to-length ratio of transistor 250 is in the range of approximately 1.5–2.0. The ratio of the gate width-to-length ratio of transistor 220 to that of 260 is approximately the same as the ratio of the gate width-to-length ratio of transistor 250 to the gate width-to-length ratio of transistor 210. The ratio of the width-to-length ratio of the pull down or latch device (i.e., 210) over the effective width-to-length ratio of the pass gate (i.e., 250) is called the Beta Ratio of the memory cell. Algebraically this equates to $$\frac{W_{210} / L_{210}}{W_{250} / L_{250}}$$

for cell 200. If transistors 210 and 250 are constructed with the same gate length, then the Beta Ratio is simply the ratio of the gate widths (i.e., $W_{210}/W_{250}$). Although FIG. 2 illustrates two pass gates (250, 260) and two pull down devices (210, 220), there is only one Beta Ratio for the cell because the cell is typically symmetrical. In other words, the load devices 240 and 230 have identical characteristics and the widths, lengths, and operational characteristics of transistors 210 and 250 are identical to those of transistors 220 and 260, respectively. Thus the Beta Ratio for prior art cell 200 is typically in the range of 1.5–2.0. The Beta Ratio for a prior art cell utilizing resistive loads is typically 2.5–3.0.

In other words, the gate width-to-length ratio of transistors 210 and 220 is up to three times that of transistors 250 and 260, respectively, in the prior art differential cell 200 when resistive loads are used. Utilizing a Beta Ratio of 1.5–2.0 in the single ended cell 400 of FIG. 4, can lead to the inability to properly latch values written to the cell during a write operation.

One method for overcoming this inability to properly latch values for cell 400 is to use a wordline boost circuit to increase the conductance (reduce the resistance) of transistor 450 during a write operation. Increasing the conductance of transistor 450 will permit a write operation which utilizes a single bitline 472. Applying a voltage greater than $V_{CC}$ to wordline 474 will increase the conductance of transistor 450. During a read operation a normal voltage (e.g., $V_{CC}$) is applied to the wordline 474 and the cell remains stable for the read operation.

Another method involves changing the Beta Ratio of memory cell 400 from that of a typical differential memory cell. For example, a memory designer may choose input pass gate transistor 450 to be twice the size of 410 and 420. By doubling the size of transistor 450 with respect to transistors 410 and 420, the memory designer has reduced the Beta Ratio of the memory cell to approximately 0.5. This will permit write operations which use normal supporting circuitry and normal wordline voltages (e.g., $V_{CC}$). However, decreasing the resistance of pass gate 450 generally causes the memory cell to be unstable with respect to read operations. In other words, a read operation may cause the cell to lose the value stored. Cell stability can be maintained by decreasing the conductance of pass gate transistor 450 during the read operation. The conductance of pass gate transistor 450 can be decreased by using a voltage less than $V_{CC}$ on wordline 474 during the read operation.

The methods applied to overcome reading or writing difficulties for the single ended single port cell 400 may be extended to the single ended dual port memory cell 300 illustrated in FIG. 3. Thus the memory cell designer may choose to maintain a Beta Ratio similar to that of the prior art differential memory cells or the memory designer may choose to design a cell with a lower Beta Ratio. Accordingly, the designer will have to modify the supporting circuitry for the write operation or the read operation.

To execute a read operation of memory cell 300 from the first port 370, wordline 374 is set to a logical high level. If cell 300 is designed to have a Beta Ratio similar to that of the prior differential memory cells, the wordline voltage should be approximately $V_{CC}$. Otherwise, if cell 300 is designed with a lower Beta Ratio, the supporting circuitry should provide a voltage less than $V_{CC}$ for the wordline 374 voltage. This turns bitline pass gate transistor 350 on to permit a data bit to be communicated from cell 300 to bitline 372. Assuming a positive logic system with respect to the first port, if cell 300 contains a logical "1," transistors 340 and 320 will be on and transistors 330 and 310 will be off. Since transistor 340 is on and transistor 310 is off, a voltage approaching $V_{CC}$ will be imposed on bitline 372 from node 351.

In the event that cell 300 contains a logical "0," transistors 310 and 330 are on and transistors 320 and 340 are off. Since transistor 310 is on and transistor 340 is off, a voltage approaching $V_{SS}$ will be imposed on bitline 372 from node 351.

The read operation as executed from the second port is similar except that the memory cell is referenced as positive logic with respect to the first port. To execute a read operation of cell 300 from the second port 380, wordline 384 is set to a logical high level. This permits bitline pass gate transistor 360 to turn on to permit a data bit to be communicated from cell 300 to bitline 382. Assuming a positive logic system with respect to the first port, transistors 340 and 320 will be on and transistors 330 and 310 will be off when cell 300 contains a logical "1," just as when the read operation is performed from the first port. Since transistor 320 is on and transistor 330 is off, a voltage approaching $V_{SS}$ will be imposed on bitline 382. Since $V_{SS}$ represents a logical "0," the supporting circuitry for the memory array will have to invert the data from bitline 382 in order to accurately represent the contents of memory cell 300. As discussed previously, inverting logic could be provided at the level of the second device port as opposed to a cell by cell basis. Another embodiment might utilize inverting logic at an intermediate level, such as with groups of bitlines.

One manner in which to execute a write operation is illustrated as follows. In order to execute a write operation to port 370, wordline 374 is raised to a logical high level. If cell 300 is designed with a typical differential memory cell Beta Ratio, the wordline 374 voltage may need to exceed $V_{CC}$. Otherwise if cell 300 is designed to have a smaller Beta Ratio, the wordline 374 voltage is approximately $V_{CC}$. This permits bitline pass gate transistor 350 to turn on with sufficient conductance so that a data bit to be written may be communicated from bitline 372 to cell 300. Assuming cell 300 is currently storing a logical level "0" (voltage at node 351 approaching $V_{SS}$), if a logical level "1" is to be written to cell 300, the logical "high" voltage on bitline 372 begins to raise the voltage at node 351. As the voltage at node 351 increases, the conductance of PMOS transistor 330 decreases and the conductance of NMOS transistor 320 increases. This decreases the voltage at node 361. As the voltage at node 361 decreases, the conductance of NMOS transistor 310 decreases and the conductance of PMOS transistor 340 increases. The voltage at node 351 increases as the conductance of NMOS transistor 310 decreases. Thus a positive feedback cycle is established and continues until transistors 310 and 330 are turned off and transistors 320 and 340 are turned on such that node 351 is latched at a voltage level approaching $V_{CC}$. Similarly, node 361 is latched at a voltage level approaching $V_{SS}$. If the cell was storing a "1" before the operation, then node 351 would simply remain at a level approaching $V_{CC}$. Regardless of the previous state of the cell, cell 300 is now latched in a logical "1" state such that the voltage imposed on bitline 372 approaches $V_{CC}$.

To ensure that this method of writing to memory cell 300 will function properly, pass gate transistor 350 is chosen so that it has a small "on" resistance (drain to source resistance) compared to the "on" resistance of 310. The same relationship holds true for the "on" resistance of pass gate transistor 360 and transistor 320. This will permit writing to memory cell 300 using typical supporting circuitry and wordline voltages ($V_{CC}$). An alternative embodiment would be to maintain the same Beta Ratio as a standard differential memory cell. As stated previously, this may require the supporting circuitry to provide voltages greater than $V_{CC}$ on the wordlines 374 or 384 during a write operation.

Transistors 330 and 340 (or resistive load devices in an alternative embodiment) are large enough to ensure cell stability while meeting leakage constraints determined by the memory designer. One embodiment might be PMOS transistors 340 and 330 which have an "on" resistance of approximately twice that of the "on" resistance of NMOS transistors 310 and 320, respectively. Another embodiment as illustrated in FIG. 5 might include resistive load devices 540 and 530 which have a resistance which is twice that of the "on" resistance of transistors 510 and 520, respectively.

Referring back to FIG. 3, the process for writing a logical "0" to port 370 is similar to the process for writing a logical "1." Wordline 374 is raised to a logical high level to permit a data bit to be communicated from bitline 372 to cell 300. If the memory cell 300 is designed with a typical differential memory cell Beta Ratio, the wordline 374 voltage may need to exceed $V_{CC}$. Otherwise if the memory cell 300 is designed to have the smaller Beta Ratio, the wordline 374 voltage is approximately $V_{CC}$. This permits bitline pass gate transistor 350 to turn on with sufficient conductance so that a data bit to be written may be communicated from bitline 372 to cell 300. Assuming cell 300 is currently storing a logical level "1" (voltage at node 351 approaching $V_{CC}$), if a logical level "0" is to be written to cell 300, the logical "low" voltage on bitline 372 begins to lower the voltage at node 351. As the voltage at node 351 decreases, the conductance of PMOS transistor 330 increases and the conductance of NMOS transistor 320 decreases. This increases the voltage at node 361. As the voltage at node 361 increases, the conductance of NMOS transistor 310 increases and the conductance of PMOS transistor 340 decreases. The voltage at node 351 decreases as the conductance of NMOS transistor 310 increases. Thus a positive feedback cycle is established and continues until transistors 310 and 330 are turned on and transistors 320 and 340 are turned off such that node 351 is latched at a voltage level approaching $V_{SS}$. Similarly, node 361 is latched at a voltage level approaching $V_{CC}$. If the cell was storing a "0" before the operation, then node 351 would simply remain at a level approaching $V_{SS}$. Regardless of the previous state of the cell, cell 300 is now latched in a logical "0" state such that the voltage imposed on bitline 372 approaches $V_{SS}$.

The process for executing a write operation to port 380 requires raising wordline 384 to a logical high level to permit a data bit to be communicated from bitline 382 to cell 300. Data to be written to port 380 should be inverted since the memory cell is based on positive logic with respect to port 370. For example, when a logical "1" is to be written to the second port of a memory device, the supporting circuitry for the array should invert the signal so that a logical "0" is presented to port 380 of cell 300. Assuming cell 300 is currently storing a logical level "0" (voltage at node 361 approaching $V_{CC}$), the logical "low" voltage on bitline 382 begins to lower the voltage at node 361. From this point, the cell operates similarly to the way in which a "1" was written to port 370. As the voltage at node 361 decreases, the conductance of PMOS transistor 340 increases and the conductance of NMOS transistor 310 decreases. This increases the voltage at node 351. As the voltage at node 351 increases, the conductance of NMOS transistor 320 increases and the conductance of PMOS transistor 330 decreases. The voltage at node 361 decreases as the conductance of NMOS transistor 320 increases. Thus a positive feedback cycle is established and continues until transistors 310 and 330 are turned off and transistors 320 and 340 are turned on such that node 361 is latched at a voltage level approaching $V_{SS}$. Similarly, node 351 is latched at a voltage level approaching $V_{CC}$. If the cell was storing a "1" before the operation, then node 361 would simply remain at a level approaching $V_{SS}$. Regardless of the previous state of the cell, cell 300 is now latched in a logical "1" state.

The operation for using port 380 to store a logical "0" using the second port of a memory device is similarly executed in that the data bit is inverted by supporting circuitry such that a logical "1" is carried by bitline 382 to the cell.

Some memory applications require writing only to one port and reading only from the other port. In this case the single ended dual port memory cell can be optimized to avoid applying multiple voltages on the wordlines. A dual port memory cell which permits read and write operations at each port is referred to as a duplex cell. If a dual port memory cell has one port dedicated for writing and another port dedicated for reading, then the cell is referred to as a simplex cell. Examples of memory applications which require writing only to one port and reading only from another port include input buffers, output buffers, and first-in-first-out buffers (FIFOs).

In the duplex dual port memory cell, symmetry with respect to the devices associated with each port is important because writing and reading operations take place at each port. Introduction of asymmetry into a duplex cell may create differences in reading or writing capabilities at each port. However, by introducing device asymmetry, first port 370 may be optimized for writing and second port 380 may be optimized for reading so that cell 300 may be used effectively as a single ended simplex dual port memory cell. The supporting circuitry would not need to provide multiple voltages on each port wordline if cell 300 were a single ended simplex dual port memory cell.

For a single ended simplex dual port memory cell, write port transistor 350 is intentionally sized larger (i.e., lower resistance) than transistor 310. By choosing a larger transistor 350, cell 300 is intentionally destabilized with respect to write port 370 so that a boost voltage (i.e., greater than $V_{CC}$) is not required on wordline 374 for a write operation.

Similarly, read port transistor 360 is intentionally sized smaller (i.e., greater resistance) than transistor 320. By choosing a smaller pass gate transistor (360), port 380 can facilitate stable reading without the use of voltages less than $V_{CC}$ on wordline 384.

Since drain-to-source resistance is inversely proportional to transistor gate widths (assuming a fixed gate length), the higher resistance devices might be fabricated as small as possible and the sizes of the less resistive devices may be chosen after determining the size of the smaller components. In one embodiment, transistors 310, 330, 340, and 360 might be chosen to have the same device geometries (i.e., gate widths are equal and gate lengths are equal). Pass gate 350 is chosen to have a significantly greater gate width than NMOS transistor 310. Conversely, NMOS transistor 320 is chosen to have a significantly greater gate width than pass gate 360. Thus using a process that permits minimum geometries of 0.5 microns, PMOS transistors 330 and 340 might have gate widths of 0.5 microns and gate lengths of 0.5 microns. Read operation pass gate 360 and transistor 310 might have gate widths of 0.5 microns and gate lengths of 0.5 microns. Write operation pass gate 350 and transistor 320 might have gate widths of 1.2 microns and gate lengths of 0.5 microns. Due to the asymmetry, cell 300 now has a write port Beta Ratio and a read port Beta Ratio which are no longer equal.

For the single ended simplex dual port cell 300, a read operation is accomplished through port 380. Transistor 360 has a greater drain-to-source resistance than 320 in order to keep the cell stable with respect to the read port when bitline 382 is carrying $V_{CC}$ and node 361 is latched at a value approaching $V_{SS}$. Thus even if bitline 382 is carrying a voltage approaching $V_{CC}$ when pass gate 360 is selected by wordline 384, the cell contents will not change (i.e., node 361 will not change from $V_{SS}$ to $V_{CC}$). However, if node 361 is latched at a value approaching $V_{CC}$ and bitline 382 is carrying $V_{SS}$, pass gate 360 may not have sufficient resistance to prevent cell 300 from changing states. This might be circumvented by ensuring that the read port bitline 382 is precharged to carry $V_{CC}$ prior to turning on wordline 384.

The single ended dual port memory cell of FIG. 3 will permit simultaneous access from both ports 370 and 380. As a duplex cell, the memory cell will permit simultaneous read operations from both ports. Cell 300 may be simultaneously accessed by one port executing a read operation and the other port executing a write operation.

Cell 300 may not operate predictably when each port is trying to write a different value although this is not of concern with a simplex cell. Also, when a read operation from one port is executed at the same time that a write operation is executed to the other port, the retrieved value may not be the expected value. These two situations, however, may be taken care of in a number of ways. One way is to simply ignore the fact that the data may not be accurate. Another way is to resolve such contention with the supporting circuitry by not permitting simultaneous access under these conditions.

Figure 7:
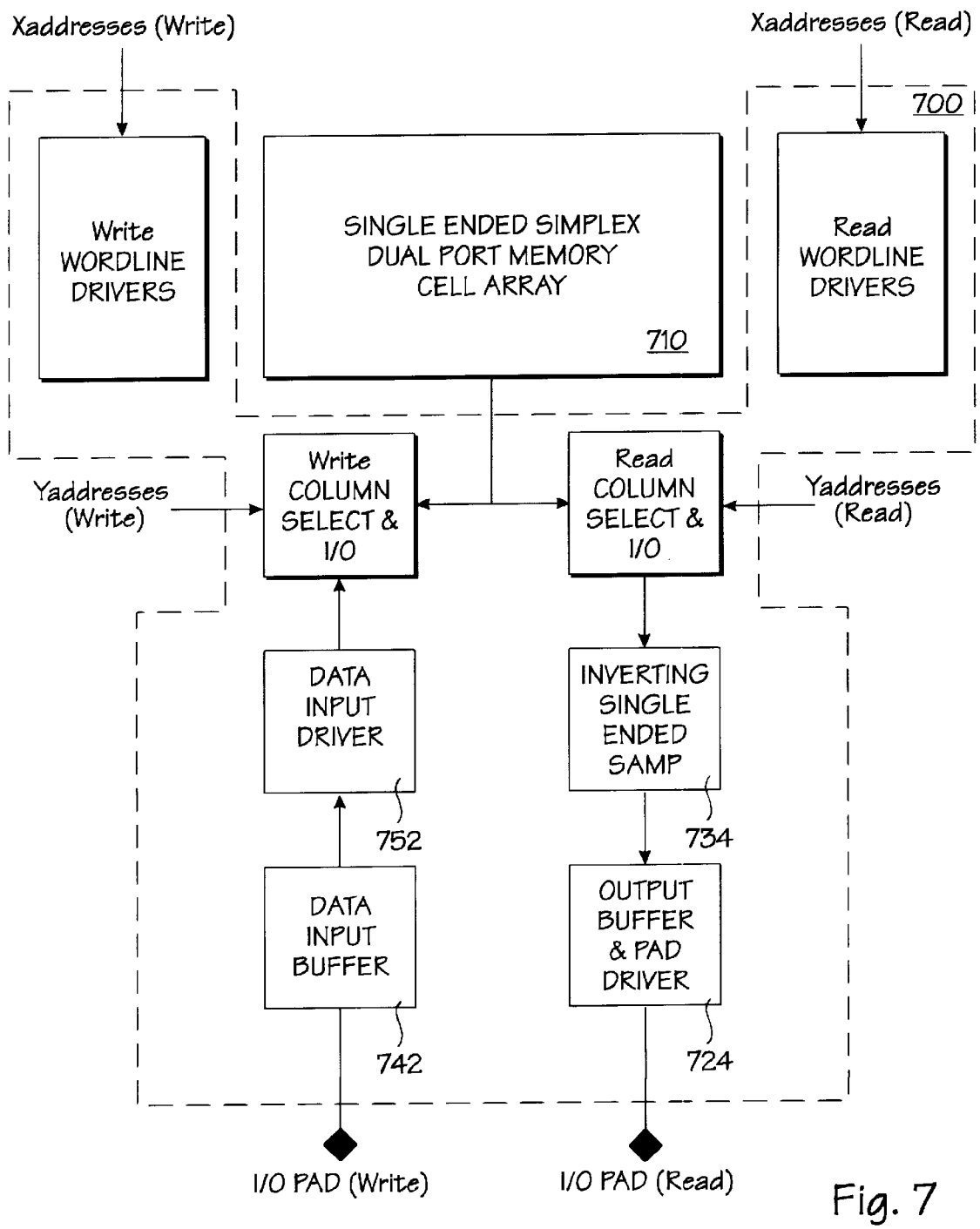
FIG. 7 illustrates a block diagram of the supporting circuitry for an array of single ended simplex dual port memory cells.

A block diagram of supporting circuitry 700 for an array of single ended simplex dual port memory cells is illustrated in FIG. 7. The inverting single ended sense amplifier 734 accomplishes the data inversion at the device level in this example. The data inversion is associated with the device read port (output buffer and pad driver 724). In the case of a FIFO structure, the X (row) and Y (column) addresses may be provided by pointers. Since read and write operations are exclusively conducted only on dedicated ports, the diagram is somewhat less complicated than the supporting circuitry diagram illustrated in FIG. 6.

Figure 1:
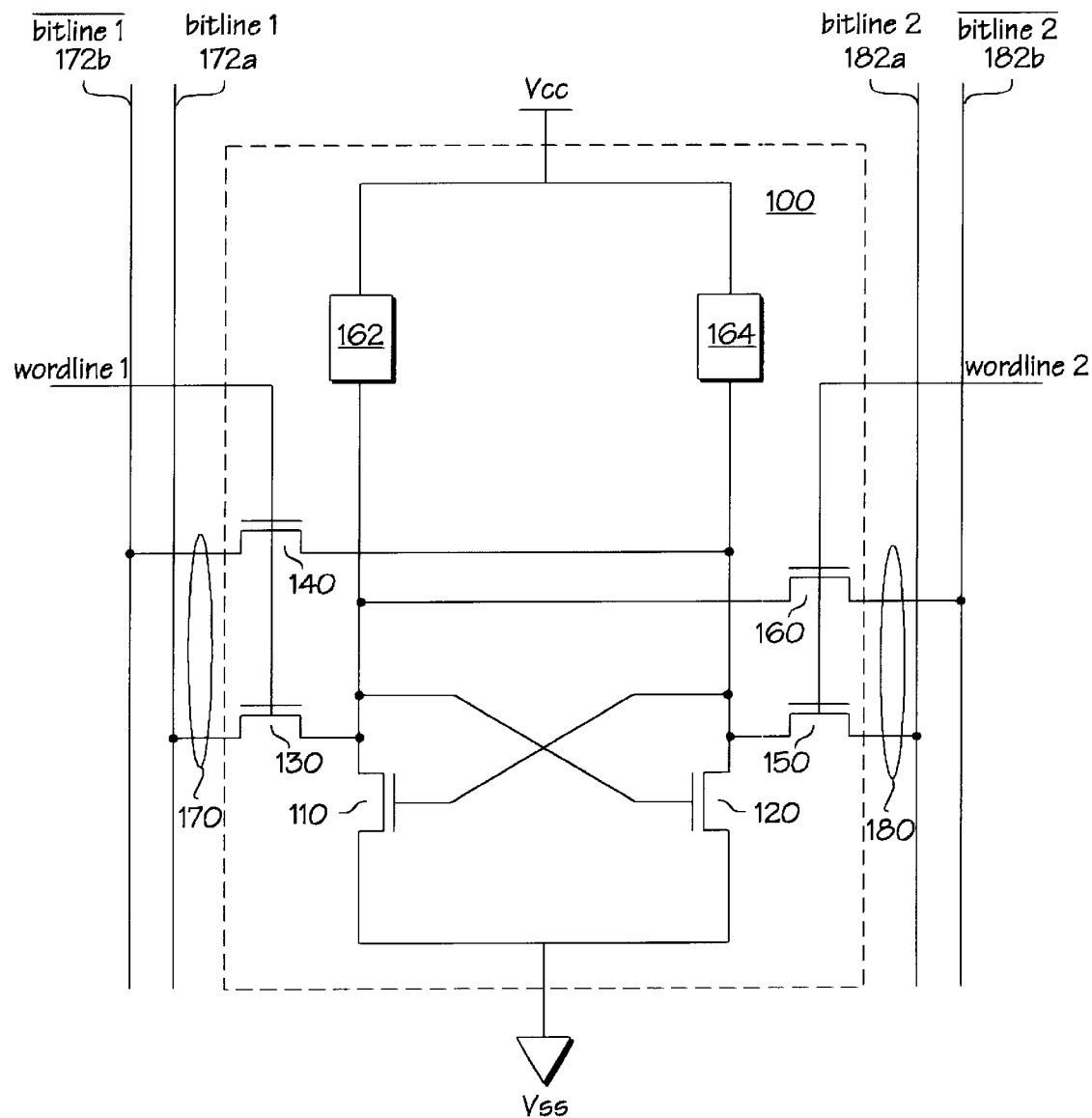
FIG. 1 illustrates a schematic for one prior art differential dual port memory cell.

By comparing FIGS. 1, 2, and 3, several advantages should become apparent. FIG. 1 illustrates a prior art dual port memory cell 100 which requires two latch transistors (110, 120), four bitline pass gate transistors (130, 140, 150, 160) and two resistive loads (162 and 164). The four bitline pass gates permit asynchronous read and write operations to occur from two separate, asynchronous ports, 170 and 180. In contrast, the embodiment illustrated in FIG. 3 only requires four latch transistors and two pass gate transistors. Thus the dual port cell 300 can achieve the functionality of dual port cell 100 with fewer memory cell components.

Another distinction between the prior art cells of FIGS. 1 and 2 and the circuit of FIG. 3 is that FIGS. 1 and 2 illustrate differential or dual ended memory cells (100 and 200), whereas FIG. 3 illustrates a single ended memory cell, 300. The contents of a memory cell are typically detected by a sense amplifier coupled to the cell. In FIG. 2, the state of the memory cell is detected by measuring the difference between a signal presented on bitline 272a and the complementary signal presented on 272b by memory cell 200. Thus the sense amplifier detects the contents of the prior art memory cell by measuring the potential difference between bitlines 272a and 272b. Likewise in FIG. 1, the state of the memory device is determined by measuring the potential difference between bitlines 172a and 172b for port 170 or by measuring the potential difference between bitlines 182a and 182b for port 180. In FIG. 3, however, the state of cell 300 may be determined by comparing the potential sensed on bitlines 372 or 382 to a reference voltage (e.g., $V_{CC}$, $V_{SS}$, or signal ground) instead of to other complementary signals provided by the memory cell (e.g., the complementary bitlines 172b and 182b of FIG. 1 or 272b of FIG. 2).

A memory device utilizing single ended simplex dual port memory cells can provide (1) the accessibility benefits typically associated with dual port cells as shown in FIG. 1 while simultaneously achieving (2) the storage capacity of a memory device constructed with the single port memory cell structure as illustrated in FIG. 2. Furthermore, since the simplex cell may be optimized for both read and write operations, the memory designer may avoid the supporting circuitry modifications required for providing multiple wordline voltages.

In the foregoing specification, the invention has been described with reference to specific exemplary embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A single ended simplex dual port memory cell comprising:
   a read transistor for reading data to the memory cell, having a first gate width-to-length ratio;
   a write transistor for writing data to the memory cell, having a second gate width-to-length ratio;
   a first pass gate transistor having a third gate width-to-length ratio, receiving a first input and being coupled to the read transistor and to a first port; and
   a second pass gate transistor having fourth gate width-to-length ratio, receiving a second input independent of the first input, and coupled to the write transistor and to a second port independent of the first port,
   wherein (a) the ratio of (i) the first gate width-to-length ratio to (ii) the third gate width-to-length ratio is greater than 1.5, and (b) the ratio of (iii) the second gate width-to-length ratio to the (iv) fourth gate width-to-length ratio is less than 1.5.

2. A memory array comprising a plurality of the single ended simplex dual port memory cells of claim 1.

3. The single ended simplex dual port memory cell of claim 1, wherein the ratio of the second gate width-to-length ratio to the fourth gate width-to-length ratio is less than or equal to approximately 0.5.

4. The single ended simplex dual port memory cell of claim 1, wherein the ratio of the first gate width-to-length ratio to the third gate width-to-length ratio is greater than 2.

5. The single ended simplex dual port memory cell of claim 3, wherein the ratio of the first gate width-to-length ratio to the third gate width-to-length ratio is greater than 2.

6. The single ended simplex dual port memory cell of claim 1, further comprising:
   a first load device receiving a first voltage and coupled to said read transistor, and
   a second load device receiving a second voltage differing from said first voltage, and coupled to said write transistor.

7. The single-ended dual port memory cell of claim 1, wherein said first pass gate transistor has (i) a first source/drain terminal coupled to a first bitline and (ii) a second source/drain terminal coupled to a gate of said read transistor, and said second pass gate transistor has (iii) a first source/drain terminal coupled to a second bitline and (iv) a second source/drain terminal coupled to a gate of said write transistor.

8. The single ended dual port memory cell of claim 1, further comprising a first load device receiving a first voltage and coupled to said read transistor, and a second load device receiving said first voltage and coupled to said write transistor.

9. The single ended dual port memory cell of claim 8, wherein said read transistor has (i) a first source/drain terminal coupled to said first load device and (ii) a second source/drain terminal coupled to a second voltage different from said first voltage, and said write transistor has (iii) a first source/drain terminal coupled to said second load device and (iv) a second source/drain terminal coupled to said second voltage.

10. The single ended simplex dual port memory cell of claim 8, wherein
   a) the first load device comprises a third transistor having a gate coupled to the gate of the read transistor, and
   b) the second load device comprises a fourth transistor having a gate coupled to the gate of the write transistor.

11. The single ended simplex dual port memory cell of claim 10 wherein the read and write transistors are NMOS transistors and the first and second load devices are PMOS transistors.

12. The single ended simplex dual port memory cell of claim 10 wherein:
   a) a gate of the first pass gate transistor is coupled to a first port wordline and a first terminal of the first pass gate transistor is coupled to a first port bitline, wherein the first pass gate transistor permits communication between the first port bitline and the memory cell only if the first port wordline is selected; and
   b) a gate of the second pass gate transistor is coupled to a second port wordline and a first terminal of the second pass gate transistor is coupled to a second port bitline, wherein the second pass gate transistor permits communication between the second port bitline and the memory cell only if the second port wordline is selected.

13. The single ended simplex dual port memory cell of claim 12, wherein:
   a) the first pass gate transistor has a gate width of approximately 0.5 microns and a gate length of approximately 0.5 microns;
   b) the read transistor has a gate width of approximately 0.5 microns and a gate length of approximately 0.5 microns;
   c) the second pass gate transistor has a gate width of approximately 1.2 microns and a gate length of approximately 0.5 microns; and
   d) the write transistor has a gate width of approximately 0.5 microns and a gate length of approximately 0.5 microns.

14. The single ended simplex dual port memory cell of claim 13, wherein each of the first and second load devices comprises a PMOS transistor having a gate width of approximately 0.5 microns and a gate length of approximately 0.5 microns.

15. The single ended simplex dual port memory cell of claim 12, wherein the read and write transistors are NMOS transistors, wherein at least one of the pass gate transistors is an NMOS transistor.

16. The single ended simplex dual port memory cell of claim 12, wherein a memory cell supporting circuitry inverts a bit communicated between the memory cell and one of a first and second bitlines.

17. The single ended simplex dual port memory cell of claim 1, wherein the read and write transistors are NMOS transistors.

18. The single ended simplex dual port memory cell of claim 1, wherein at least one of the first and second pass gate transistors is an NMOS transistor.

19. The single ended simplex dual port memory cell of claim 6, wherein the read and write transistors are each a first type of transistor and the first and second load devices are each a second type of transistor.

20. The single ended simplex dual port memory cell of claim 8, wherein the read and write transistors are NMOS transistors and the first and second load devices are PMOS transistors.

21. A memory cell, comprising:
   a first port having an associated first passgate, read transistor, first wordline and first bitline; and
   a second port having an associated second passgate, write transistor, second wordline and a second bitline,
   wherein a first resistivity ratio of said first passgate to said read transistor is greater than a second resistivity ratio of said second passgate to said write transistor and said first and second wordlines are independent of one another.

* * * * *